United States Patent
Sugawara et al.

(10) Patent No.: US 12,281,380 B2
(45) Date of Patent: Apr. 22, 2025

(54) CRN COATING FILM AND SLIDING MEMBER

(71) Applicant: TPR Co., Ltd., Tokyo (JP)

(72) Inventors: Syun Sugawara, Tokyo (JP); Takatsugu Iwashita, Tokyo (JP)

(73) Assignee: TPR Co., Ltd., Tokyo (JP)

( * ) Notice: Subject to any disclaimer, the term of this patent is extended or adjusted under 35 U.S.C. 154(b) by 0 days.

(21) Appl. No.: 18/035,779

(22) PCT Filed: Aug. 6, 2021

(86) PCT No.: PCT/JP2021/029273
§ 371 (c)(1),
(2) Date: May 8, 2023

(87) PCT Pub. No.: WO2022/137631
PCT Pub. Date: Jun. 30, 2022

(65) Prior Publication Data
US 2023/0416903 A1    Dec. 28, 2023

(30) Foreign Application Priority Data
Dec. 23, 2020   (JP) ................................. 2020-213722

(51) Int. Cl.
C23C 14/06    (2006.01)
C23C 14/32    (2006.01)
F16J 9/26     (2006.01)

(52) U.S. Cl.
CPC .......... C23C 14/0641 (2013.01); C23C 14/32 (2013.01); F16J 9/26 (2013.01)

(58) Field of Classification Search
CPC ... C23C 14/0461; C23C 14/32; C23C 14/325; C23C 14/34
See application file for complete search history.

(56) References Cited

U.S. PATENT DOCUMENTS

| | | | |
|---|---|---|---|
| 4,486,285 A | 12/1984 | Aubert et al. | |
| 10,006,546 B2 | 6/2018 | Sato et al. | |
| 2015/0093586 A1 | 4/2015 | Kawai et al. | |
| 2016/0238132 A1* | 8/2016 | Sato | C23C 14/0641 |

FOREIGN PATENT DOCUMENTS

| | | |
|---|---|---|
| JP | S58-144473 A | 8/1983 |
| JP | H07-27228 A | 1/1995 |
| JP | H11335813 A | 12/1999 |
| JP | 2001-335878 A | 12/2001 |
| JP | 2010-168603 A | 8/2010 |
| JP | 2011-194536 A | 10/2011 |
| JP | 2011-218513 A | 11/2011 |
| JP | 2019-66024 A | 4/2019 |
| WO | WO-2013/136510 A1 | 9/2013 |
| WO | WO-2015/046437 A1 | 4/2015 |

OTHER PUBLICATIONS

Lugscheider, E., et al. "Investigation of Mechanical Properties of CrN-PVD Thin Films by Nanoindentation." MRS Online Proceedings Library 522 (1998): 227-232.*
Third Party Observation in JP Application No. 2020-213722 dated Jun. 5, 2024, 29 pages.
Search Report in International Application No. PCT/JP2021/029273 dated Sep. 21, 2021.
Schiavi et al., "Indentation Modulus, Indentation Work and Creep of Metals and Alloys at the Macro-Scale Level: Experimental Insights Into the Use of a Primary Vickers Hardness Standard Machine", Materials, vol. 14, 2912, 2021, 17 pages.
Herrmann et al., "CIRP Sponsored International Comparision on Nanoindentation", Metrologia, vol. 47, 2010, pp. S50-S58.
Extended European Search Report in EP Application No. 21909791.2 dated Mar. 28, 2024, 8 pages.
Binns et al., "Preferred Orientation and its Effects on Intensity-Correlation Measurements", IUCrJ, vol. 9, 2022, pp. 231-242.
Office Action in IN Application No. 202317030858 dated Mar. 5, 2025, 7 pages.

* cited by examiner

Primary Examiner — Jessee R Roe
(74) Attorney, Agent, or Firm — Marshall, Gerstein & Borun LLP

(57) ABSTRACT

The present invention addresses the problem of providing a CrN coating film which has excellent peeling resistance such that peeling thereof starting at a crack is unlikely to occur even in a more severe lubrication environment. The problem is solved by a CrN coating film which has a preferred orientation of 200 as determined by XRD, and in which the X-ray diffraction intensity ratio of the (200) plane with respect to the (111) plane, (200)/(111), is 5.5 or higher, and the ratio of crystal grains of 1 μm or smaller is 85% or higher in a crystal grain size distribution measured by an EBSD analysis.

6 Claims, 6 Drawing Sheets

CRN COATING FILM AND SLIDING MEMBER

TECHNICAL FIELD

The present invention relates to: a CrN film; and a sliding member coated with the CrN film.

BACKGROUND ART

A CrN coating film, which is arranged on a sliding surface of a sliding member used in a severe sliding environment, is required to have good sliding properties and wear resistance. For example, in a piston ring used in an internal combustion engine, the load applied to the surface of the piston ring tends to be increased in association with an increase in the cylinder internal pressure, direct injection of fuel, reduction in the viscosity of a lubricating oil being used, and the like. As a result, there are cases where a CrN coating film covering the surface of the piston ring is cracked and/or peeled off due to the effect of sliding.

In order to solve this problem, a coating film having a composition in which one element selected from the group consisting of carbon, phosphorus, nitrogen, boron, and silicon is solid-dissolved in metallic chromium, which coating film exhibits high hardness, hydrogen embrittlement resistance, toughness, and fatigue resistance, has been proposed (see Patent Document 1).

Further, it has been disclosed that the sliding characteristics and the peeling resistance are improved by a coating film which is formed of CrN-type chromium nitride and in which the crystal lattice constant and the Cr content are in specific ranges (see Patent Document 2).

Moreover, it has been disclosed that a high-toughness coating film excellent in wear resistance, particularly in resistance to cracking and peeling, is provided by allowing a coating film which has a composition including a mixture of $Cr_2N$ and metallic chromium with nitrogen solid-dissolved therein to have a specific diffraction peak (see Patent Document 3).

RELATED ART DOCUMENTS

Patent Documents

[Patent Document 1] Japanese Unexamined Patent Application Publication No. S58-144473
[Patent Document 2] Japanese Unexamined Patent Application Publication No. 2001-335878
[Patent Document 3] WO 2013/136510

SUMMARY OF THE INVENTION

Problems to be Solved by the Invention

As described above, CrN coating films having excellent peeling resistance have been proposed. However, during sliding in a more severe lubrication environment, these coating films are likely to be peeled off, starting at a crack. An object of the present invention is to provide: a CrN coating film which has excellent peeling resistance such that peeling thereof starting at a crack is unlikely to occur even in such a more severe lubrication environment; and a sliding member coated with the same.

Means for Solving the Problems

The present inventors conducted studies to solve the above-described problem and consequently discovered that the problem can be solved by reducing the size of crystals forming a CrN coating film and controlling the preferred orientation in a specific range, thereby completing the present invention.

The present invention is a CrN coating film which has a preferred orientation of 200 as determined by XRD (X-Ray Diffractometry), and in which the X-ray diffraction intensity ratio of the (200) plane with respect to the (111) plane, (200)/(111), is 5.5 or higher, and the ratio of crystal grains of 1 µm or smaller is 85% or higher in a crystal grain size distribution measured by an EBSD (Electron BackScatter Diffraction pattern) analysis. It is preferred that crystal grains having a size of 2.3 µm or larger be absent, and it is more preferred that crystal grains having a size of 2.0 µm or larger be absent.

Further, in a preferred mode, the CrN coating film has a micro-Vickers hardness of 800 HV to 1,300 HV. By controlling the coating film to have a low hardness while being a dense film, the coating film is made less brittle and improved in peeling resistance, which is preferred. When the micro-Vickers hardness is lower than 800 HV, the wear resistance may be insufficient, while when the micro-Vickers hardness is higher than 1,300 HV, the coating film tends to be cracked or lost by handling thereof in processing.

Moreover, in a preferred mode, the CrN coating film has a plastic work rate of 61% to 69% as measured using a Vickers indenter in accordance with the international standard for nanoindentation test, ISO14577-1. The "plastic work rate" refers to a ratio of plastic deformation work with respect to a total indentation work in an indentation test. In a coating film having a high plastic work rate, the resistance to peeling thereof starting at a crack is improved. When the plastic work rate is less than 61%, the hardness tends to be higher than 1,300 HV, while when the plastic work rate is more than 69%, the hardness tends to be lower than 800 HV.

Another mode of the present invention is a sliding member that includes a sliding surface coated with the above-described CrN coating film.

Effects of the Invention

According to the present invention, the following can be provided: a CrN coating film which has excellent peeling resistance such that peeling thereof starting at a crack is unlikely to occur even in a more severe lubrication environment; and a sliding member coated with the same.

MODE FOR CARRYING OUT THE INVENTION

Figure 1:
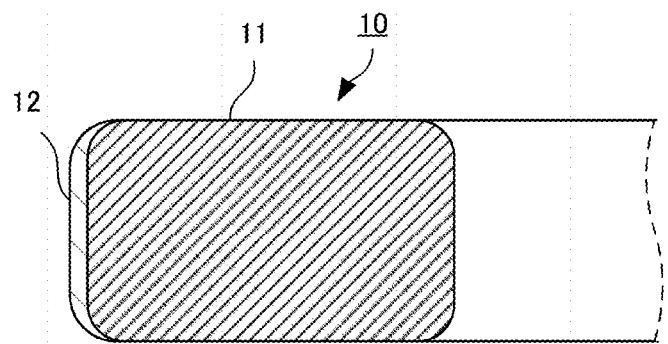
FIG. 1 is a schematic cross-sectional view of a piston ring coated with a CrN film, which is one mode of the present invention.

One embodiment of the present invention is a CrN coating film. This CrN coating film contains CrN as a main component, and may also contain $Cr_2N$, metallic chromium in which nitrogen is solid-dissolved, unavoidable impurities, and the like. The type of a phase constituting the CrN coating film can be evaluated by XRD (X-Ray Diffractometry). The composition of the CrN coating film can be analyzed using an EPMA (Electron Probe MicroAnalyzer). In the CrN coating film, the content of Cr may be 45% by atom or more, 50% by atom or more, but 60% by atom or less. Further, the nitrogen content in the coating film may be 40% by atom or more, 50% by atom or more, but 55% by atom or less.

In the present embodiment, the CrN coating film has a preferred orientation of 200 as determined by XRD, the X-ray diffraction intensity ratio of the (200) plane with respect to the (111) plane, (200)/(111), is 5.5 or higher, and the ratio of crystal grains of 1 μm or smaller is 85% or higher in a crystal grain size distribution measured by an EBSD analysis.

The CrN coating film exhibits an improved peeling resistance by having a preferred orientation of 200 as determined by XRD, and an X-ray diffraction intensity ratio of the (200) plane with respect to the (111) plane, (200)/(111), of 5.5 or higher, preferably 6 or higher, more preferably 6.5 or higher. An upper limit of the X-ray diffraction intensity ratio is not limited, and it is usually 20 or lower and may be 10 or lower.

The CrN coating film is made dense by controlling the ratio of crystal grains of 1 μm or smaller in a crystal grain size distribution measured by an EBSD analysis to be 85% or higher, preferably 86% or higher, more preferably 90% or higher, and the CrN coating film exhibits an improved peeling resistance since cracks, even if they were generated, are unlikely to be connected with each other. An upper limit of this ratio is not limited, and may be 100% or lower, 99% or lower, or 95% or lower.

In the CrN coating film, the plastic work rate is preferably 61% or higher, more preferably 64% or higher, but preferably 69% or lower, as measured using a Vickers indenter in accordance with the international standard for nanoindentation test, ISO14577-1. The CrN coating film of the present embodiment is dense and has a high plastic work rate.

Further, the CrN coating film has a micro-Vickers hardness of preferably 800 HV to 1,300 HV, more preferably 1,100 HV or less, still more preferably 1,000 HV or less. By preventing the micro-Vickers hardness of the coating film from being excessively high, the coating film is made less brittle, and its peeling resistance is improved.

In order to obtain the CrN coating film of the present embodiment, it is preferred to form a CrN coating film by the below-described ion plating method. Particularly, by modifying the position and the shape of a control magnet arranged around a cathode, the behavior of arc spots formed on the surface of a target material during discharging can be modified to control the physical properties of the resulting CrN coating film.

FIG. 1 is a cross-sectional view of a portion of a piston ring that is one example of the present embodiment. A piston ring 10 has a CrN coating film 12 on upper and lower surfaces and a sliding surface (the surface on the left side in the drawing). In the present embodiment, the piston ring 10 has the CrN coating film 12 at least on the sliding surface; however, the CrN coating film may also be provided on other surfaces, for example, the upper and lower surfaces and the outer circumferential surface. The thickness of the CrN coating film on the sliding surface is not particularly limited, and it may be usually 3 μm or more, or 5 μm or more, but usually 50 μm or less, or 30 μm or less. It is noted here that the piston ring is one mode of a sliding member,
and examples of the sliding member include pistons, bearings, washers, and valve lifters, in addition to piston rings.

In the case of a piston ring, a substrate 11 of the piston ring 10 is not particularly limited in terms of its material as long as the material is conventionally used as a piston ring substrate. For example, a stainless steel material or a steel material can be preferably used and, specifically, martensitic stainless steel, silicon-chromium steel, or the like is preferably used.

Between the CrN coating film and the piston ring substrate, for example, a Cr-plated coating film, a chromium nitride coating film, or a titanium nitride coating film may be further provided, or the CrN coating film may be formed directly on the piston ring substrate. When the substrate is made of stainless steel, a nitriding treatment may be performed on the substrate.

The CrN coating film can be formed by a physical vapor deposition process, such as an ion plating method or a sputtering method. An example where the CrN coating film is formed by an ion plating method will now be described referring to a drawing.

Figure 2:
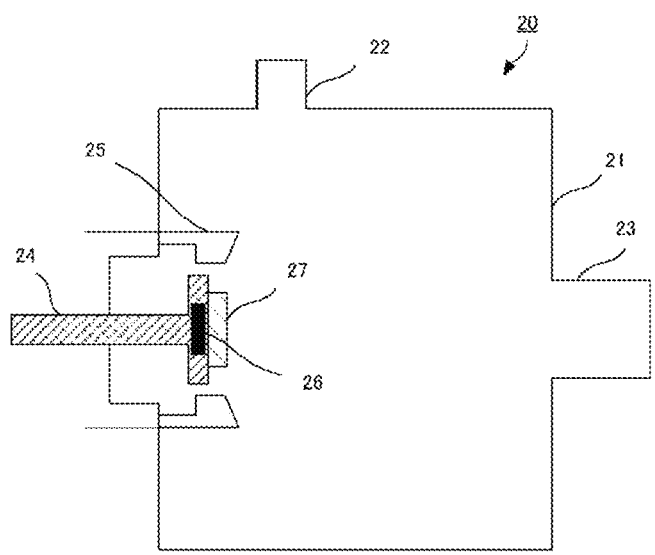
FIG. 2 is a schematic drawing of an apparatus used for depositing a CrN coating film on a piston ring by an ion plating method.

FIG. 2 is a schematic cross-sectional view illustrating one example of an apparatus 20 used for the formation of a CrN coating film by an ion plating method. A gas introduction pipe 22 and a vacuum exhaust pipe 23 are connected to a vacuum chamber 21, and the temperature inside the vacuum chamber 21 can be controlled using a heater (not illustrated). The apparatus also includes a cathode 24 and an anode 25, a control magnet 26 is arranged at the tip of the cathode 24 (the right end of the cathode in the drawing), and a target material 27 is plasma-ionized by arc discharge.

Inside the vacuum chamber 21, a piston ring is set on a rotary table (not illustrated), and the target material, which is chromium, is ionized and deposited on the surface of the piston ring while introducing a nitrogen gas from the gas introduction pipe 22. The operating conditions of the apparatus in this process can be set as follows: arc current=100 to 200 A, bias voltage=0 to 50 V, chamber internal pressure=1 to 4 Pa, temperature of heating by heater=300 to 400° C.

The nitrogen content in the resulting CrN can be controlled by adjusting the internal pressure and the nitrogen partial pressure of the introduced gas.

The properties of the resulting CrN coating film can also be controlled by modifying the position and the shape of the control magnet arranged around the cathode. For example, by arranging the magnet such that the magnet revolves around the tip of the cathode, arc spots are reduced in size, so that the speed of each arc spot moving on the cathode surface is increased and the generated plasma reaches the vicinity of the piston ring; therefore, the ionization rate is improved, making a denser CrN coating film more likely to be formed.

EXAMPLES

The present invention will now be described in more detail by way of Examples; however, the present invention is not limited only to the below-described Examples.

The physical property values of a coating film were measured using the following apparatuses.

<X-Ray Diffraction Measurement>

The preferred orientation of a coating film was determined by XRD using an XRD apparatus (D8 DISCOVER, manufactured by Bruker AXS GmbH). Using an XRD tube and a CuKα radiation as X-ray, the measurement was performed at a tube voltage of 40 kV and a tube current of 40 mA in a range of 2θ=30 to 90°. A piston ring coated with a CrN coating film on the outer circumferential surface was cut and used as a sample, and this sample was irradiated with X-ray from the side of the outer circumferential sliding surface to perform the measurement. From the thus obtained XRD figure, the peak intensities of the (111) plane and the (200) plane of CrN were determined, and the ratio thereof was calculated.

<Measurement of Crystal Grain Size (EBSD Analysis)>

The crystal grain size of a coating film was measured using an FE-SEM (JSM-7100F, manufactured by JEOL Ltd.) and an EBSD analysis software (DigiView IV, manufactured by TSL Solutions, Ltd.). The measurement was performed with an accelerating voltage of 15.0 kV at measurement intervals of 0.02 μm for a measurement area of 20 μm×20 μm. A piston ring coated with a CrN coating film on the outer circumferential surface was cut and used as a sample, and the outer circumferential sliding surface of this sample was polished with a diamond slurry and then ultrasonically cleaned, after which the sample was subjected to Ar ion milling to remove polishing marks, and subsequently irradiated with an electron beam from the side of the outer circumferential surface to perform the measurement. The electron beam was irradiated to the inclined sample, and the reflection electron diffraction pattern (Kikuchi lines) was measured from scattered electron beam. The Kikuchi lines were analyzed to prepare inverse pole figures for the respective crystal orientations. From the thus obtained inverse pole figures, continuous measurement points within a misorientation of 5° or less were collectively defined as a single crystal grain, and an inverse pole figure map of the measurement area was prepared. From the inverse pole figures, the grain size of each crystal grain was measured, and the area ratio of the crystal grains with respect to the whole measurement area was calculated at 0.1-μm intervals. From the thus prepared histogram of the crystal grain size distribution at intervals, the ratio of the crystal grains having a size of 1 μm or smaller with respect to the whole measurement area (area ratio) was calculated.

<Components of Coating Film>

The components of a coating film were measured by EPMA. For the EPMA measurement, EPMA-1720HT manufactured by Shimadzu Corporation was employed. A quantitative analysis was performed using pure Cr and BN as standard Cr and N samples, respectively, at an accelerating voltage of 15 kV, an irradiation current of 50 nA, and an electron beam diameter of 100 μm. A sample was prepared by the same procedure as the sample used in the EBSD analysis. Taking the intensity measured for the respective standard samples as 100%, the amount (% by weight) of the thus prepared sample was determined from the ratio of the intensity of the respective standard samples with the intensity of an unknown sample. For the elements to be measured, the thus obtained total amount (% by weight) was normalized to be 100%, and the amount of each element was calculated in % by atom.

<Plastic Work Rate>

For the measurement of the plastic work rate of a coating film, a nanoindentation analyzer (model HM-2000, manufactured by Fischer Instruments K.K.) was employed. By the method according to ISO14577-1, the plastic work rate was measured using a Vickers indenter at an indentation load of 1,000 mN with the time before reaching a maximum indentation load being set at 30 s (seconds). As a sample, a piece obtained by cutting a piston ring coated with a CrN coating film on the outer circumferential surface, embedding the resultant in a resin, and then polishing the outer circumferential surface as a measurement surface using an emery paper and a diamond slurry, was used. The plastic work rate was defined as plastic deformation work ηplast determined from a load-indentation depth curve.

EXAMPLES AND COMPARATIVE EXAMPLES

As a piston ring substrate, a steel material equivalent to JIS G3651 SWOSC-V was prepared and processed into a piston ring shape (φ73.0 mm×1.0 mm in thickness). On this piston ring substrate, a CrN coating film was formed using the apparatus for forming a CrN coating film by an ion plating method, which apparatus is schematically illustrated in FIG. 2. The formation of the CrN coating film was carried out under the conditions shown in Table 1 below.

Figure 3:
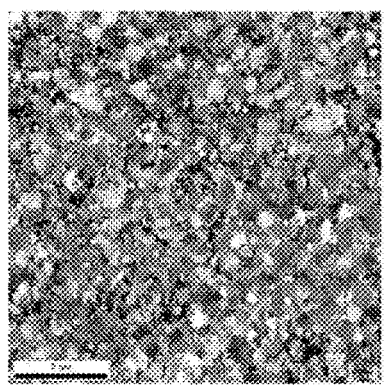
FIG. 3 is an enlarged image (drawing substitute) of crystal grains forming a CrN film obtained in an Example.
Figure 4:
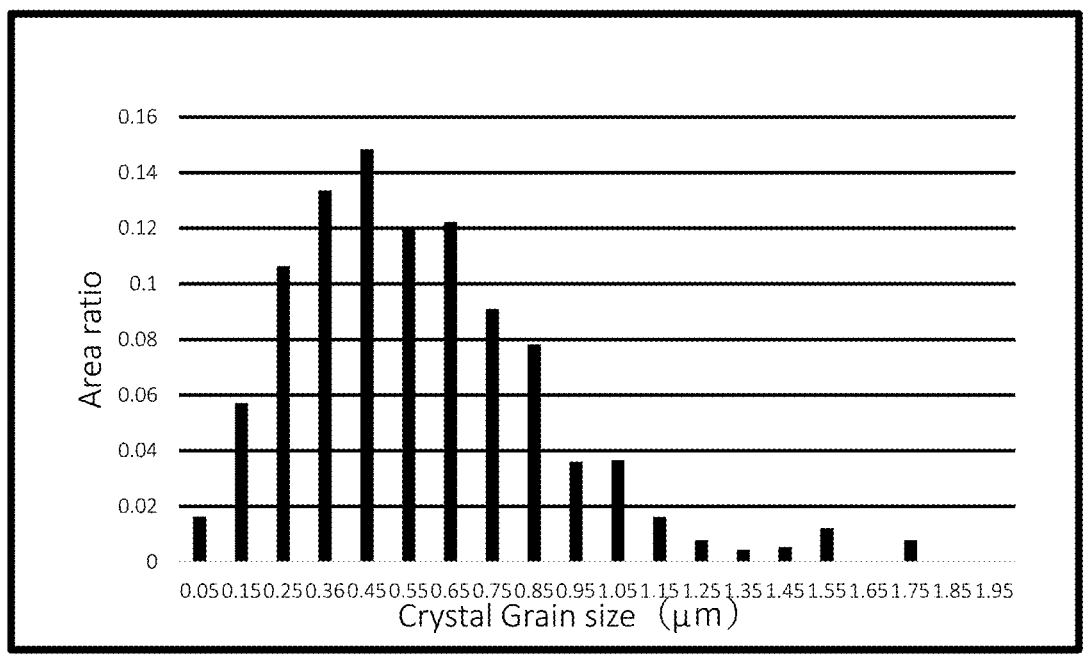
FIG. 4 is a graph showing the crystal grain size distribution of the CrN coating film of Example 1.

Next, the physical properties of the thus formed CrN coating film were measured. The results thereof are shown in Table 2. It is noted here that all of the CrN coating films had a preferred orientation of 200. Further, in Examples, crystal grains having a size of 2.0 μm or larger were absent. The crystal grains and the crystal grain size distribution of the CrN coating film of Example 1 are shown in FIGS. 3 and 4, respectively.

<Peeling Resistance Test>

Figure 5:
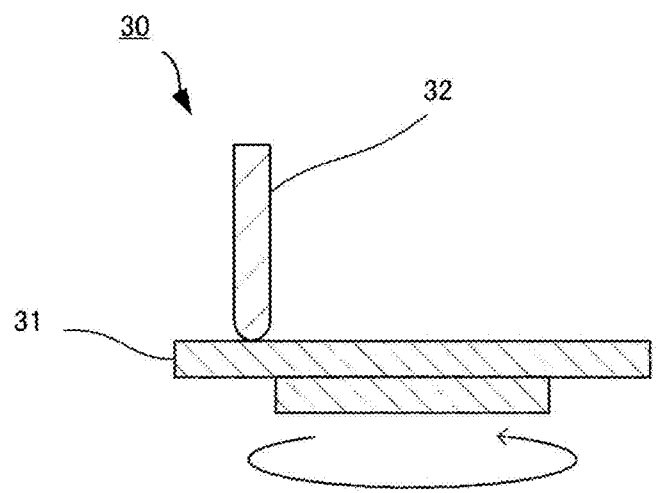
FIG. 5 is a schematic cross-sectional view of a pin-on-disk tester used for a peeling resistance test.

In a peeling resistance test, a piston ring piece was pressed against the side surface of a disk rotating at a constant speed, and the relative peeling resistance was evaluated based on the presence or absence of damage (cracking and peeling) to the sliding surface after a certain period of operation. The peeling resistance was evaluated as "A" when the sliding surface was not peeled off, "B" when the size of a peeled portion had a maximum length of less than 100 μm, or "C" when the size of a peeled portion had a maximum length of 100 μm or more. FIG. 5 shows a schematic cross-sectional view of a pin-on-disk tester used for the peeling resistance test. In a pin-on-disk tester 30, a pin (upper test piece) 32 is pressed against the side surface of a disk (lower test piece) 31 rotating at a constant speed. A piston ring piece was used as the pin (upper test piece) 32.

As for the test conditions, the test was conducted at a load of 40 N and a speed of 5 to 10 m/s for a period of 5 minutes using a OW-20 lubricating oil. The disk was made of S45C steel, and had a surface roughness of 1.5 μm in terms of the 10-point average roughness Rzjis according to JIS-B0601 (2001).

As for the evaluation method, an image of sliding marks was photographed under a metallurgical microscope (inverted metallurgical microscope GX71, manufactured by Olympus Corporation), and the maximum length of peeling marks was measured using an image analysis software (industrial image analysis software OLYMPUS Stream, manufactured by Olympus Corporation).

TABLE 1

| | |
|---|---:|
| Arc current | 100-200 A |
| Bias voltage | 0-50 V |
| Chamber internal pressure | 1-4 Pa |
| Temperature of heating by heater | 300-400° C. |

TABLE 2

| | X-ray diffraction intensity ratio (200)/(111) | Ratio of crystal grains of 1 μm or smaller (%) | Coating film hardness (HV) | Plastic work rate (%) | Evaluation of peeling resistance |
|---|---|---|---|---|---|
| Example 1 | 6.0 | 95 | 1000 | 65 | A |
| Example 2 | 7.0 | 90 | 950 | 67 | A |
| Example 3 | 6.5 | 90 | 1050 | 63 | A |
| Example 4 | 9.5 | 85 | 800 | 69 | A |
| Example 5 | 5.5 | 85 | 1280 | 61 | A |
| Example 6 | 6.0 | 95 | 790 | 70 | A |
| Example 7 | 5.5 | 90 | 1340 | 57 | B |
| Example 8 | 6.0 | 85 | 1300 | 59 | B |
| Comparative Example 1 | 5.0 | 95 | 1000 | 65 | C |
| Comparative Example 2 | 5.5 | 80 | 860 | 69 | C |
| Comparative Example 3 | 4.0 | 85 | 1120 | 62 | C |
| Comparative Example 4 | 5.0 | 80 | 1190 | 60 | C |

Figure 6:
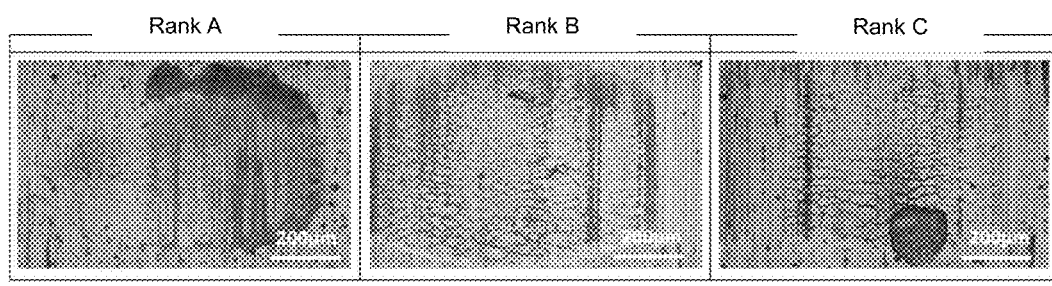
FIG. 6 shows images (drawing substitutes) of CrN films after a peeling resistance test.

The peeling resistance test was conducted for each of the CrN coating films obtained in Examples 1 to 8 and Comparative Examples 1 to 4. The peeling resistance test was carried out based on the observation of the coating film surface after a pin-on-disk sliding test as described above. FIG. 6 shows some of the observation results and evaluation examples. The results are shown in Table 2.

According to the observation results, the CrN coating films of Examples were partially cracked; however, they were either not peeled at all or peeled off only at a size of less than 100 μm in maximum length. On the other hand, the CrN coating films of Comparative Examples were not only cracked but also peeled off at a size of 100 μm or more in maximum length.

DESCRIPTION OF SYMBOLS

10: piston ring
11: piston ring substrate
12: CrN coating film
20: CrN coating film-forming apparatus
21: vacuum chamber
22: gas introduction pipe
23: vacuum exhaust pipe
24: cathode
25: anode
26: control magnet
27: target material
30: pin-on-disk tester
31: disk (lower test piece)
32: pin (upper test piece)

The invention claimed is:

1. A CrN coating film, having a preferred orientation of 200 as determined by XRD,
    wherein
    an X-ray diffraction intensity ratio of a (200) plane with respect to a (111) plane, (200)/(111), is 5.5 or higher, and
    a ratio of crystal grains of 1 μm or smaller is 85% or higher in a crystal grain size distribution measured by an EBSD analysis.

2. The CrN coating film according to claim 1, having a micro-Vickers hardness of 800 HV to 1,300 HV.

3. The CrN coating film according to claim 1, having a plastic work rate of 61% to 69% as measured using a Vickers indenter in accordance with ISO14577-1.

4. A sliding member, comprising a sliding surface coated with the CrN coating film according to claim 1.

5. A sliding member, comprising a sliding surface coated with the CrN coating film according to claim 2.

6. A sliding member, comprising a sliding surface coated with the CrN coating film according to claim 3.

* * * * *